(12) United States Patent
Kamamori et al.

(10) Patent No.: US 8,134,173 B2
(45) Date of Patent: Mar. 13, 2012

(54) LIGHTING DEVICE HAVING LIGHT EMITTING ELEMENT MOUNTED IN GLASS SUBSTRATE

(75) Inventors: Hitoshi Kamamori, Chiba (JP); Sadao Oku, Chiba (JP); Hiroyuki Fujita, Chiba (JP); Keiichiro Hayashi, Chiba (JP)

(73) Assignee: Seiko Instruments Inc. (JP)

( * ) Notice: Subject to any disclaimer, the term of this patent is extended or adjusted under 35 U.S.C. 154(b) by 60 days.

(21) Appl. No.: 12/653,537

(22) Filed: Dec. 15, 2009

(65) Prior Publication Data

US 2010/0163919 A1 Jul. 1, 2010

(30) Foreign Application Priority Data

Dec. 25, 2008 (JP) ................................. 2008-331371
Oct. 16, 2009 (JP) ................................. 2009-238959

(51) Int. Cl.
*H01L 33/62* (2010.01)
(52) U.S. Cl. .................................. 257/99; 257/E33.072
(58) Field of Classification Search ............ 257/98–100, 257/433, E33.072, E33.055, E33.061
See application file for complete search history.

(56) References Cited

U.S. PATENT DOCUMENTS

| | | | |
|---|---|---|---|
| 7,499,288 B2 * | 3/2009 | Tanaka et al. ................. | 361/767 |
| 7,528,414 B2 * | 5/2009 | Huang et al. | |
| 7,598,528 B2 * | 10/2009 | Oh et al. | |
| 7,598,532 B2 * | 10/2009 | Fujita et al. | |
| 7,675,132 B2 * | 3/2010 | Waitl et al. | |
| 7,696,526 B2 * | 4/2010 | Tay et al. | |
| 7,709,855 B2 * | 5/2010 | Ooya et al. | |
| 7,728,344 B2 * | 6/2010 | Chang et al. | |
| 7,728,507 B2 * | 6/2010 | Winter et al. | |
| 7,812,358 B2 * | 10/2010 | Yasuda | |
| 7,838,357 B2 * | 11/2010 | Bogner et al. | |
| 7,892,869 B2 * | 2/2011 | Chuang et al. | |
| 2002/0134988 A1 * | 9/2002 | Ishinaga | |
| 2002/0139990 A1 * | 10/2002 | Suehiro et al. | |
| 2003/0006421 A1 * | 1/2003 | Yasukawa et al. ............... | 257/98 |
| 2003/0185526 A1 * | 10/2003 | Hohn et al. ...................... | 385/93 |
| 2003/0189830 A1 * | 10/2003 | Sugimoto et al. ............. | 362/294 |
| 2003/0201451 A1 * | 10/2003 | Suehiro et al. .................. | 257/98 |
| 2004/0036081 A1 * | 2/2004 | Okazaki .......................... | 257/99 |
| 2007/0139908 A1 * | 6/2007 | Tsuda .............................. | 362/84 |
| 2007/0228391 A1 * | 10/2007 | Minami et al. .................. | 257/79 |
| 2007/0267645 A1 * | 11/2007 | Nakata et al. ................... | 257/98 |
| 2008/0079019 A1 * | 4/2008 | Huang et al. .................... | 257/99 |
| 2009/0072251 A1 * | 3/2009 | Chan et al. ...................... | 257/89 |
| 2009/0283781 A1 * | 11/2009 | Chan et al. ...................... | 257/89 |
| 2010/0001258 A1 * | 1/2010 | Shimizu et al. ................. | 257/13 |
| 2010/0019224 A1 * | 1/2010 | Shimizu et al. ................. | 257/13 |

(Continued)

*Primary Examiner* — Nathan Ha
(74) *Attorney, Agent, or Firm* — Adams & Wilks

(57) ABSTRACT

A lighting device has a glass substrate and a lead frame embedded in the glass substrate. The glass substrate has a front surface, a side surface and a rear surface, the front surface having a recess portion with a bottom surface. The lead frame has a portion exposed on the side surface of the glass substrate and a portion exposed on the bottom surface of the recess portion. A line width of a region of the portion of the lead frame exposed on the bottom surface of the recess portion is narrower than a line width of a region of the portion of the lead frame exposed on the side surface of the glass substrate. A light emitting element is mounted in the recess portion of the glass substrate and is electrically connected with the portion of the lead frame exposed on the bottom surface of the recess portion. A sealing material covers the light emitting element.

18 Claims, 14 Drawing Sheets

U.S. PATENT DOCUMENTS

| | | | |
|---|---|---|---|
| 2010/0123154 A1* | 5/2010 | Lee | 257/98 |
| 2010/0155748 A1* | 6/2010 | Chan et al. | 257/89 |
| 2010/0289055 A1* | 11/2010 | Tan et al. | 257/100 |
| 2010/0301371 A1* | 12/2010 | Roth et al. | 257/98 |
| 2011/0031521 A1* | 2/2011 | Yoon et al. | 257/98 |
| 2011/0037091 A1* | 2/2011 | Fushimi | 257/98 |
| 2011/0062864 A1* | 3/2011 | Shimizu et al. | 313/506 |
| 2011/0085336 A1* | 4/2011 | Blumel et al. | 362/255 |

* cited by examiner

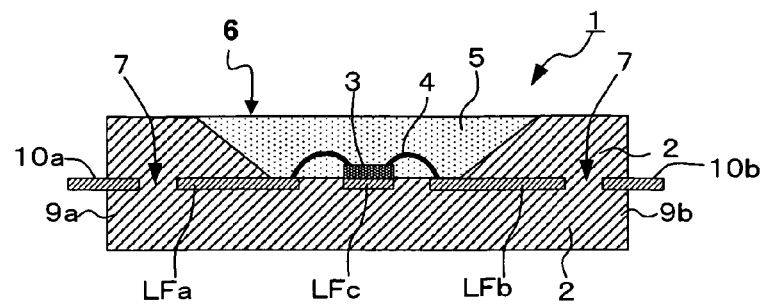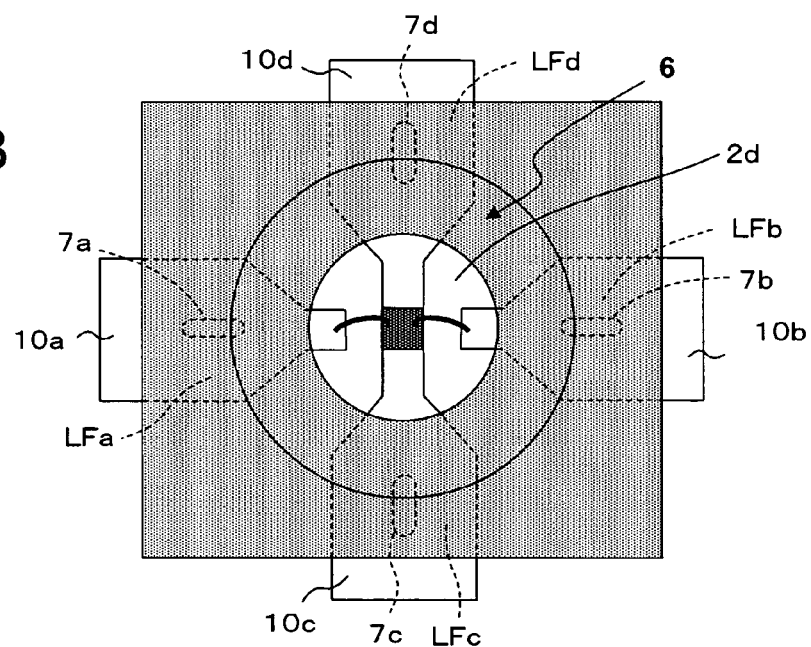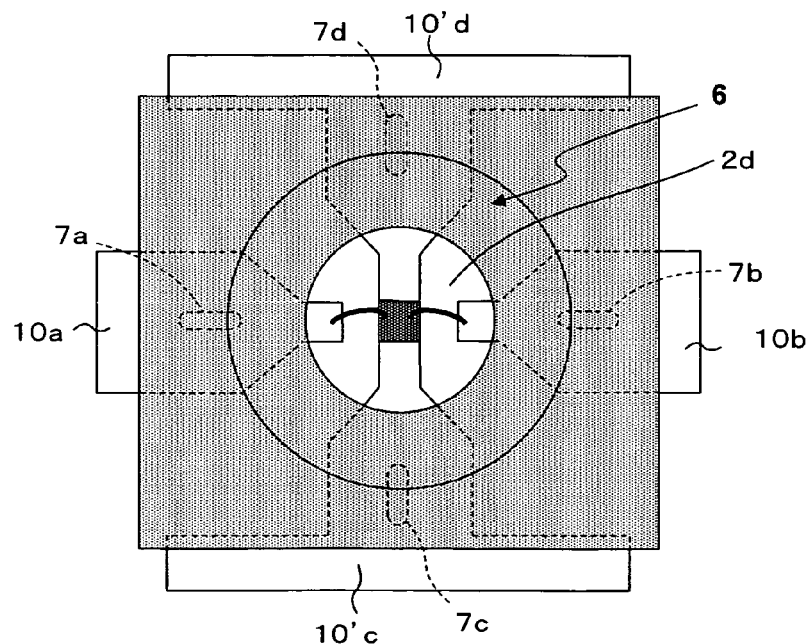

Fig. 11A
Fig. 11E
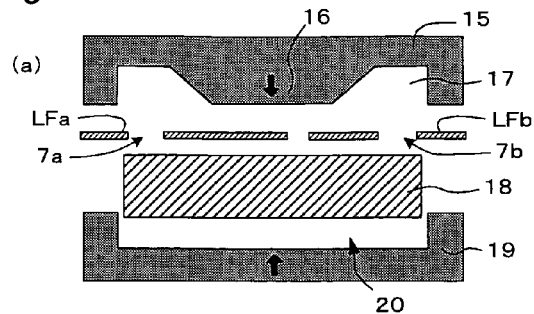
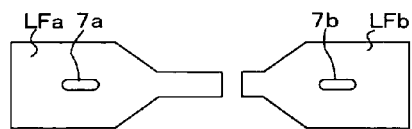
Fig. 11B
Fig. 11F
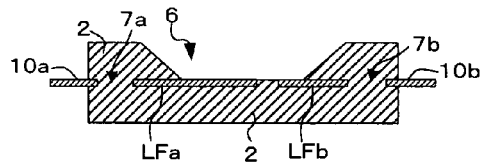
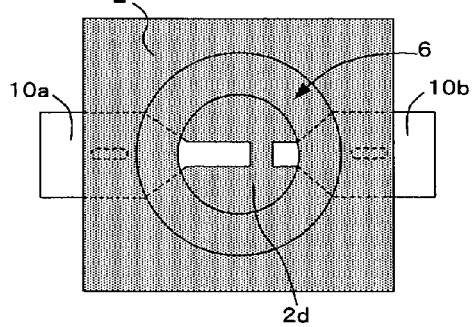
Fig. 11C
Fig. 11G
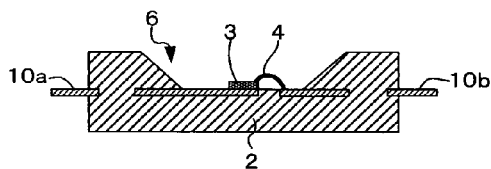
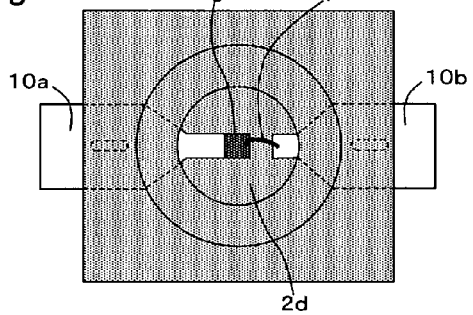
Fig. 11D
Fig. 11H
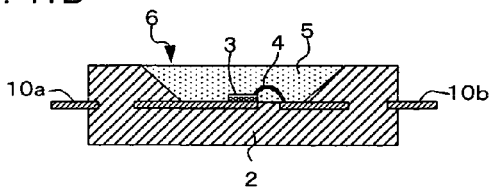
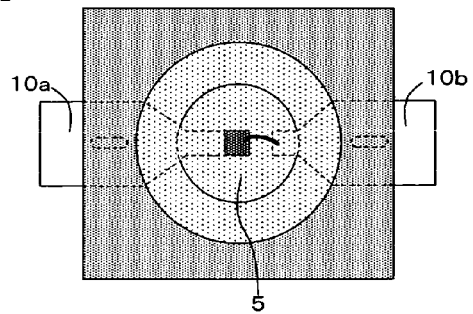

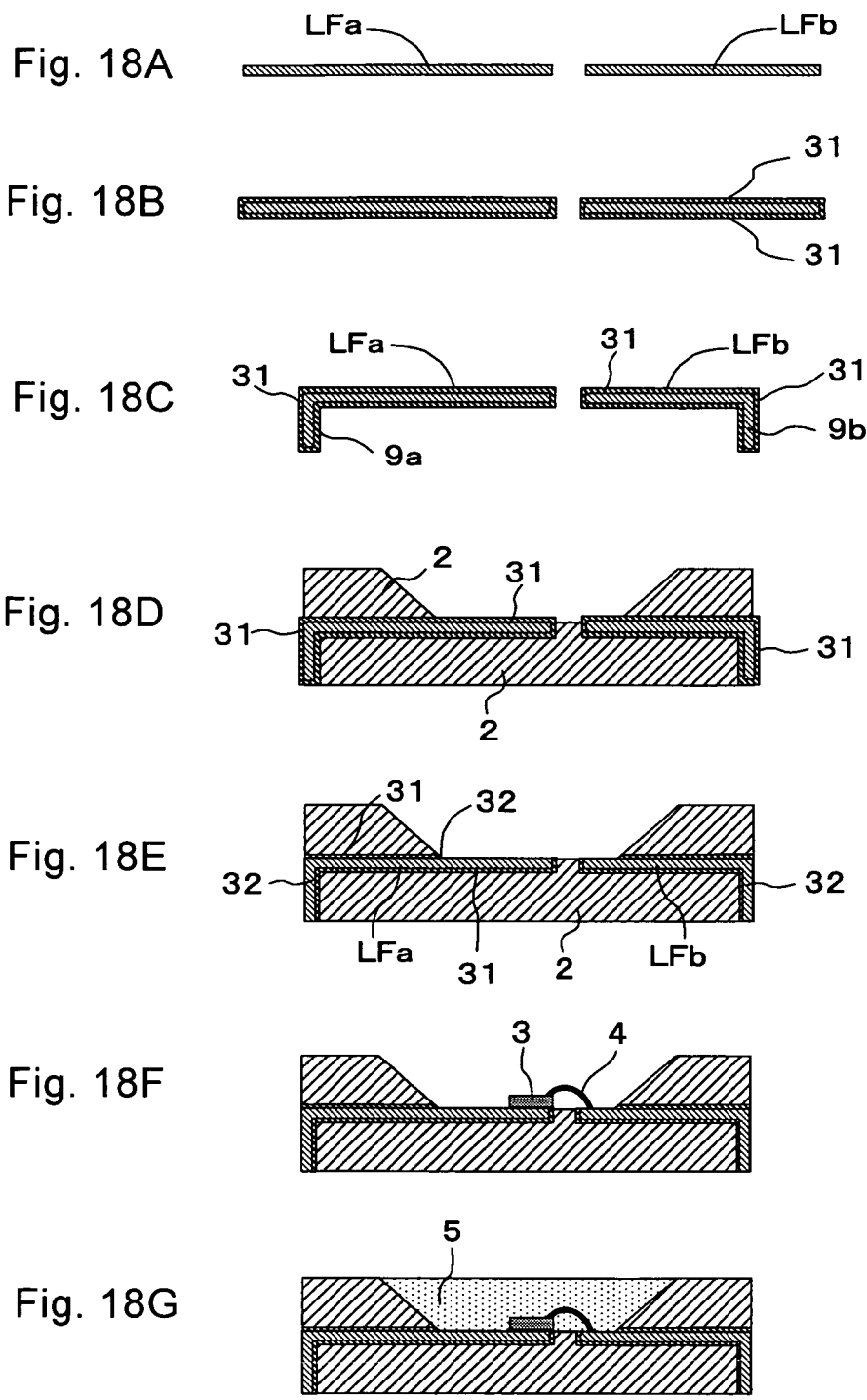

PRIOR ART

PRIOR ART

LIGHTING DEVICE HAVING LIGHT EMITTING ELEMENT MOUNTED IN GLASS SUBSTRATE

BACKGROUND OF THE INVENTION

1. Field of the Invention

The present invention relates to a lighting device in which a light emitting element is mounted in a package material using a glass substrate.

2. Description of the Related Art

In recent years, an electronic component using a glass package has been put to practical use. A glass material prevents moisture or contaminants from entering from the outside and attains high airtightness. The glass material is close in thermal expansion coefficient to a silicon substrate in which a semiconductor element is formed. Therefore, reliability of bonding is improved in case that the semiconductor element is mounted in the glass package. Moreover, the glass material is low in cost, and hence an increase in product cost may be suppressed.

FIG. 19 schematically illustrates a cross sectional structure of an LED lighting device in which an LED element is mounted in a glass material. Such a structure is disclosed in, for example, FIG. 1 of JP 2007-042781 A (hereinafter, referred to as Patent Document 1). As illustrated in FIG. 19, through-electrodes 52 are formed in a glass substrate 51. Electrode metallizations 53B for connecting are formed on the through-electrodes 52. A plurality of LED elements 56A are mounted on the electrode metallizations 53B. Upper surfaces of the LED elements 56A are electrically connected to one of the electrode metallizations 53B through wires 57. Electrode metallizations 53A for external connection are formed on a lower surface of the glass substrate 51. The electrode metallizations 53A are electrically connected to the through-electrodes 52. Therefore, power may be supplied to the LED elements 56A from the electrode metallizations 53A formed on the lower surface.

A Si substrate 54 formed with a through hole 58 is provided on an upper surface of the glass substrate 51 so as to surround the LED elements 56A. The Si substrate 54 is anodically bonded to the upper surface of the glass substrate 51. The Si substrate 54 has an inclined inner wall surface. A reflective film 55 is formed on the inner wall surface. Light emitted from the LED elements 56A are reflected on the reflective film 55 and emitted as light having directivity in an upward direction. The plurality of LED elements 56A are mounted, and hence a light emission intensity may be increased. Heat generated from the LED elements 56A may be radiated to the outside through the through-electrodes 52 and the electrode metallizations 53A.

The through-electrodes 52 of the glass substrate 51 are formed as follows. That is, an inner wall of the through hole formed in the glass substrate 51 is plated with Cu or Ni, and then the through hole is filled with a conductive resin or solder. The electrode metallizations 53A located on the rear surface (lower surface) of the glass substrate 51 are formed as follows. A Ti layer is deposited on a surface of a glass material by sputtering or evaporation. A Pt layer or a Ni layer which serves as a barrier layer for protecting the Ti layer is deposited on the Ti layer by sputtering or evaporation. Then, an Au layer for protecting surface oxidation is deposited by sputtering or evaporation. The resultant layers are patterned by a photo process.

FIG. 20 schematically illustrates a lighting device 60 in which an LED light emitting element 61 is embedded in a glass material. Such a structure is disclosed in, for example, FIG. 1 of JP 2007-306036 A (hereinafter, referred to as Patent Document 2). FIG. 21 illustrates the lighting device 60 in a state immediately before being subjected to glass sealing using a mold (see FIG. 3 of Patent Document 2). The LED light emitting element 61 is surface-mounted on a sub-mount 63 through bumps 62. The sub-mount 63 is connected to step portions formed in tip ends of leads 64A and 64B and covered with a sealing member 65. Glass is used for the sealing member 65. The sealing member 65 made of glass is formed so as to be thin on a lower side of the leads 64A and 64B and to be convexly thick on an output side of light emitted from the LED light emitting element 61.

In the entire lighting device 60, the LED light emitting element 61 is surrounded by a transparent glass portion and a metal portion which each have a thermal expansion coefficient in a range of 150% to 500% of that of the LED light emitting element 61. The feeding members (leads 64A and 64B) and the sealing member 65 are made larger in thermal expansion coefficient than the LED light emitting element 61 or the sub-mount 63. Therefore, a stress direction may be adjusted to prevent the occurrence of cracks due to a thermal shrinkage difference.

A method of manufacturing the lighting device 60 is as follows. A thin glass sheet 68, the sub-mount 63 on which the LED light emitting element 61 is mounted, the two leads 64A and 64B electrically connected to the sub-mount 63, and a thick glass sheet 67 located above the sub-mount 63 are set between an upper mold 71 having a semicircular recessed portion 71A formed on a surface and a lower mold 72 having a recessed portion 72A with a flat bottom. Then, while the glass sheets 67 and 68 are softened by heating at 450° C. in a vacuum atmosphere, the upper mold 71 and the lower mold 72 are moved in directions indicated by arrows to press the glass sheets 67 and 68. As a result, the glass sheets 67 and 68 are formed into the same dome shape as the sealing member 65 illustrated in FIG. 20.

However, when the conductive resin is filled into the through holes as described in Patent Document 1 and hardened by heat treatment to form the through-electrodes, it is difficult to maintain airtightness because of shrinkage during hardening. Moreover, the LED light emitting element generates heat during light emission. Therefore, when the LED light emitting element is repeatedly turned on and off, a temperature cycle occurs in which a temperature is repeatedly increased and decreased, and hence expansion and shrinkage are repeated. As a result, the airtightness of the interface between glass and the through-electrodes reduces, and hence moisture enters from the outside, to thereby shorten the life of the LED light emitting element.

In Patent Document 1, the conductive resin or solder is filled into the through holes and hardened to form the through-electrodes. A conductor film is further deposited by sputtering or evaporation and a rear surface electrode pattern is formed by a photo process using a photo mask. As a result, the number of manufacturing steps increases, and hence a manufacturing cost becomes higher.

In the LED light emitting element described in Patent Document 2, the sealing member 65 located on the light emitting surface side is warped to be in a dome shape, or a convex shape, and hence light emitted from the LED light emitting element 61 is diffused to all directions. Therefore, the light emitted from the LED light emitting element 61 may not be condensed in an upward direction or provided with directivity in the upward direction, and hence the emitted light may not be effectively used. In the lighting device 60, the thermal expansion coefficient of the sealing member 65 is adjusted to a value larger than the thermal expansion coefficient of the LED light emitting element 61 or the sub-mount 63 such that an internal stress based on the thermal expansion coefficient difference becomes a compression stress toward the center of the LED light emitting element 61, to thereby prevent cracks from occurring in the glass material. Thus, when the shape of the sealing member 65 sealing the LED light emitting element 61 is to be changed to, for example, a recessed shape to emit light having directivity, the compression stress toward the center is unbalanced, and hence it is likely to cause cracks to reduce reliability.

In the manufacturing method described in Patent Document 2, the sealing member made of glass is softened to seal the LED light emitting element 61, and hence the LED light emitting element 61 is exposed to a high temperature equal to or higher than, for example, 450° C. When the LED light emitting element is connected to wires by wire bonding, the wires are crushed by the glass because the softened glass has a high viscosity. When phosphors are to be dispersed in the sealing member 65 to convert a wavelength of light emitted from the LED light emitting element into another wavelength, the type of usable phosphor is limited because of the high temperature. Moreover, it is difficult to uniformly disperse phosphors in high-temperature and high-viscosity glass, and hence a desired effect may not be obtained. Therefore, there is a problem that the structure of the LED light emitting element or the mounting structure is limited.

SUMMARY OF THE INVENTION

In view of the above, an object of the present invention is to provide an electronic device which may be manufactured with a reduced number of manufacturing steps and has high reliability, and a method of manufacturing the electronic device.

According to the present invention, a lighting device has a structure in which a light emitting element is mounted on a glass substrate having a front surface, a rear surface opposite to the front surface, and a side surface located in circumference. A recess portion is formed on the front surface of the glass substrate. A lead frame is embedded in the glass substrate so as to be exposed on the side surface of the glass substrate and a bottom surface of the recess portion. A portion of the lead frame which is exposed in the recess portion is electrically connected to the light emitting element. A sealing material is provided to cover the light emitting element.

A projected portion protruding downward is provided in the lead frame. The projected portion passes through the glass substrate and is exposed on the rear surface of the glass substrate. Further, the projected portion is formed immediately under a mounting surface of the light emitting element.

Further, the glass substrate has one of white color and milky white color at least in a region of the glass substrate in which the recess portion is formed. The sealing material is made of metal alkoxide.

Further, a thermal expansion coefficient difference between the glass substrate and the lead frame is set to be equal to or smaller than $4\times10^{-6}$/K (K is kelvin). Further, the glass substrate has a thermal expansion coefficient which is in a range of $8\times10^{-6}$/K to $11\times10^{-6}$/K and the lead frame has a thermal expansion coefficient which is in a range of $4\times10^{-6}$/K to $15\times10^{-6}$/K.

Examples of a material of the lead frame may include an alloy containing Ni and Fe, and a clad material in which different metal materials are bonded to each other. The clad material includes a metal which is Cu.

A thin film made of Au is formed for the lead frame. An oxide film which is an oxide of a metal material contained in the lead frame is formed at a bonding interface between the lead frame and the glass substrate.

A through hole is formed in a region of the lead frame which is embedded in the glass substrate. The lead frame protrudes from the side surface of the glass substrate.

With the structure as described above, the airtightness and the reliability in a temperature cycle are improved.

BRIEF DESCRIPTION OF THE DRAWINGS

In the accompanying drawings:

FIGS. 4A to 4C are schematic explanatory views illustrating a lighting device according to variation 3 of Embodiment 1;

FIGS. 11A to 11H are flow views illustrating a lighting device manufacturing method;

FIGS. 18A to 18G are schematic explanatory views illustrating a lighting device manufacturing method;

DETAILED DESCRIPTION OF THE PREFERRED EMBODIMENTS

A lighting device according to the present invention has a structure in which a light emitting element is mounted on a glass substrate. The glass substrate has a front surface, a rear surface opposite to the front surface, and side surfaces located in periphery. The front surface has a recess portion. The light emitting element is mounted on the recess portion. Lead frames are embedded in the glass substrate. Parts of the lead frames are exposed on the side surfaces of the glass substrate and a bottom surface of the recess portion. A part of the lead frame which is exposed on the bottom surface of the recess portion is electrically connected to the light emitting element. The light emitting element is covered with a sealing material. With such a structure, a contact-strength between the glass substrate and the lead frame is high, and hence a lighting device having excellent durability may be realized. Parts of the lead frames which are exposed on the side surfaces may be used as terminals for applying a voltage to the light emitting element.

The lead frames may be provided with a projected portion which passes through the glass substrate and is exposed on the rear surface. When the lead frames are provided with the projected portion, heat generated in the light emitting element is radiated to the outside through the lead frames or the projected portion. When the projected portion is formed immediately under a region in which the light emitting element is mounted, radiation efficiency is further improved.

Hereinafter, the lighting device according to the present invention is specifically described with reference to the attached drawings.

[Embodiment 1]

Figure 1A:
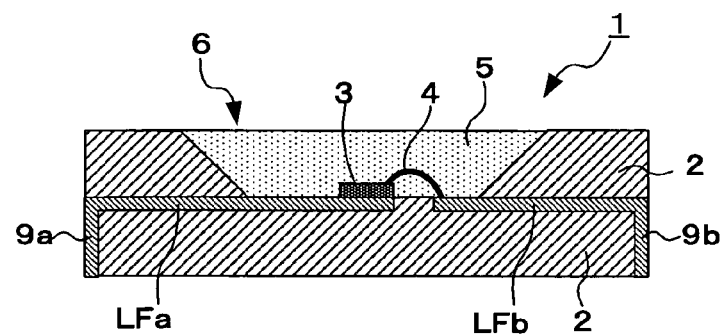
FIGS. 1A and 1B are schematic explanatory views illustrating a lighting device according to Embodiment 1 of the present invention.
Figure 1B:
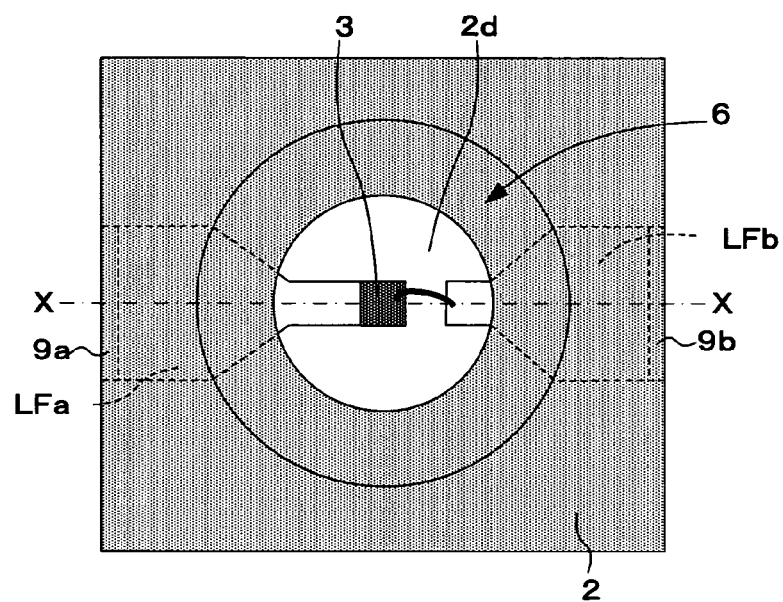

FIGS. 1A and 1B are schematic views illustrating a lighting device according to Embodiment 1 of the present invention. FIG. 1A is a cross sectional view illustrating the lighting device and FIG. 1B is a top view illustrating the lighting device. A cross section of a portion taken along the line X-X of FIG. 1B is illustrated in FIG. 1A. A recess portion 6 is provided at a central portion of a glass substrate 2. The recess portion 6 has a mortar shape in which a diameter is increased in an upward direction. In FIGS. 1A and 1B, an electrode (not shown) is formed on a lower surface of an LED 3 and electrically connected to a lead frame LFa through a conductive material (not shown). An electrode (not shown) is formed on an upper surface of the LED 3 and electrically connected through a wire 4 made of Au or the like to a lead frame LFb exposed on a bottom surface of the recess portion 6. A sealing material 5 is applied to the recess portion 6 and covers and seals the LED 3 and the wire 4 so as to prevent the LED 3 and the wire 4 from being exposed to air.

Note that each of the lead frames is a conductor integrally formed with a metal or alloy which has a thin plate shape or a linear shape. Therefore, the lead frame may be a conductor formed by etching or stamping a tape-shaped metal plate as used in semiconductor fields, or a linear conductor formed by extending a metal.

As illustrated in FIG. 1B, a line width of a region of each of the lead frames LFa and LFb which is exposed on a bottom surface 2d of the recess portion 6 is narrower than a line width of a region of each of the lead frames LFa and LFb which is located around the recess portion 6 and passes through the glass substrate 2. The lead frames LFa and LFb are bent along side surfaces of the glass substrate 2 and bonded to the glass substrate 2. Bent portions of the lead frames LFa and LFb serve as terminals 9a and 9b. Power is supplied between the terminals 9a and 9b to emit light from the LED 3. The light emitted from the LED 3 travels upward and is reflected upward on a wall surface of the recess portion 6, and hence the light may be provided with directivity. The lead frame LFa is located under the LED 3, and hence heat generated in the LED 3 may be radiated to the outside through the lead frame LFa.

That is, the lead frames LFa and LFb serve as not only power supply units but also radiation units.

A thermal expansion coefficient difference between the glass substrate 2 and the lead frames LFa and LFb is desirably set to a value equal to or smaller than $4\times10^{-6}$/K. Even in a case where the glass substrate 2 and the lead frames LFa and LFb are exposed to a heat cycle due to the repetition of on/off of the mounted LED 3, when the thermal expansion coefficient difference is set to a value equal to or smaller than $4\times10^{-6}$/K, the bonding between the lead frames LFa and LFb and the glass substrate 2 is maintained, and hence airtightness is held between the lead frames LFa and LFb and the glass substrate 2. Therefore, the reliability of the mounted LED 3 is improved.

A thermal expansion coefficient of the glass substrate 2 is set in a range of $8\times10^{-6}$/K to $11\times10^{-6}$/K and a thermal expansion coefficient of the lead frames LFa and LFb is set in a range of $4\times10^{-6}$/K to $15\times10^{-6}$/K. As a result, a usable material range of the lead frames LFa and LFb may be extended without a significant increase in thermal expansion coefficient difference with the glass substrate 2.

A NiFe alloy or Kovar may be used for the lead frames LFa and LFb. For example, a 42% NiFe alloy or a 45% NiFe alloy may be used. The alloys are close in thermal expansion coefficient to the glass material and have excellent bonding with the glass material. When surfaces of rear surface electrodes 3a and 3b formed of the lead frames LFa and LFb are plated with Ni or Au, soldering is facilitated. A thickness of the lead frames LFa and LFb is in a range of substantially 0.1 mm to 0.5 mm.

A multilayer film made of metal or insulator may be formed on an inclined surface and bottom surface of the recess portion 6 to serve as a reflective surface. As a result, the light emitted from the LED 3 may be efficiently reflected upward. Instead of the formation of the reflective film, a material exhibiting white color or milky white color may be used for the glass substrate 2. For example, the glass material may be mixed with an oxide such as phosphoric acid ($P_2O_5$), alumina ($Al_2O_3$), calcium oxide (CaO), born oxide ($B_2O_3$), magnesium oxide (MgO) or barium oxide (BaO), to thereby obtain a milky white glass. The white color or milky white color is not changed by the light emitted from the LED 3 or heat generated in the LED 3, and hence the deterioration of the lighting device 1 may be prevented.

The sealing material 5 is provided after the glass substrate 2 is formed and processed, and hence a material with a viscosity suitable to disperse phosphors may be selected as the sealing material 5. The sealing material 5 is not exposed to a high temperature at which glass is softened. Therefore, a choice of options for phosphors to be mixed into the sealing material 5 is not limited. The sealing material 5 to be used may be a silicon oxide obtained by curing metal alkoxide or polymetalloxane generated from metal alkoxide. When metal alkoxide or polymetalloxane generated from metal alkoxide is used as the sealing material 5 as described above, the lighting device 1 may be manufactured using only inorganic materials.

Variations of the lead frame concerning Embodiment 1 will be explained as follows.

(Variation 1)

Figure 2A:
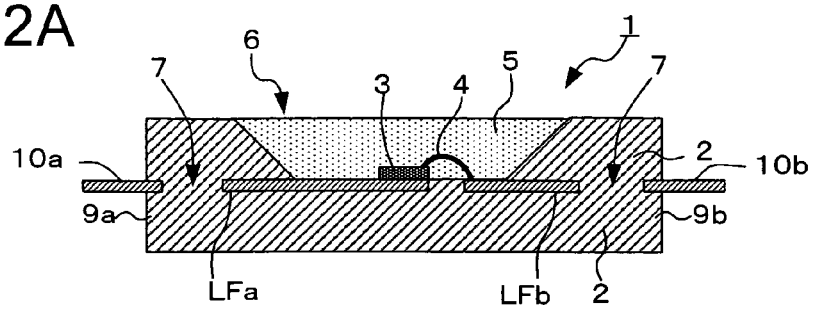
FIGS. 2A and 2B are schematic explanatory views illustrating a lighting device according to variation 1 of Embodiment 1.
Figure 2B:
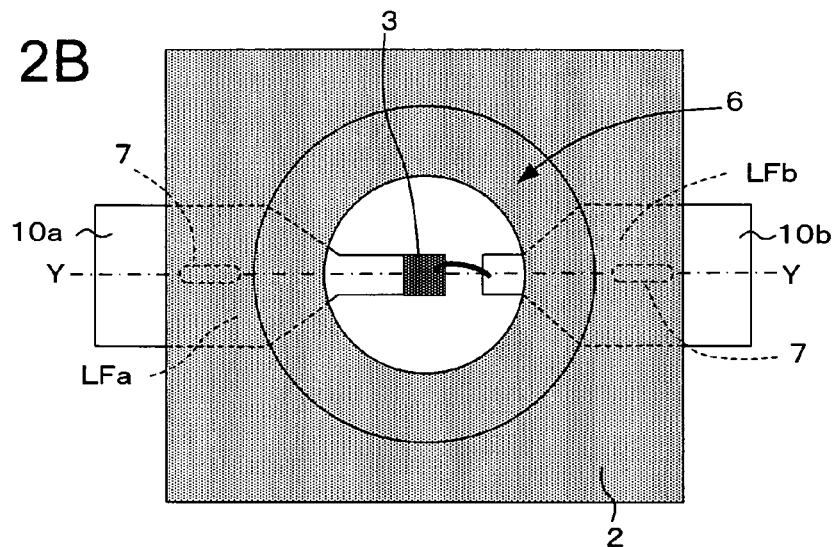

A lighting device 1 illustrated in FIGS. 2A and 2B is an example of transforming the composition shown in FIG. 1. FIG. 2B is a top view illustrating the lighting device 1 and FIG. 2A illustrates a cross section of a portion taken along the line Y-Y of FIG. 2B. The recess portion 6 is formed in the central portion of the glass substrate 2. The recess portion 6 has the mortar shape in which the diameter is increased in the upward direction. The lead frames LFa and LFb pass through the glass substrate 2 from the bottom surface of the recess portion 6 and are exposed on the side surfaces of the glass substrate 2. The lead frames LFa and LFb protrude from the side surfaces of the glass substrate 2 and protruded portions of the lead frames LFa and LFb serve as terminals 10a and 10b. Therefore, heat generated in the LED 3 is transferred to the terminals 10a and 10b through the lead frames LFa and LFb and radiated to the outside. The terminals 10a and 10b are not bonded to the glass substrate 2, and hence the radiation efficiency is improved.

In this variation 1, the lead frames LFa and LFb have through holes 7 in regions of the lead frames LFa and LFb which are embedded in the glass substrate 2. The through holes 7 are formed to promote the flow of the glass material in the case where the lead frames LFa and LFb are embedded in the glass substrate 2. That is, when the lead frames LFa and LFb are set on the glass substrate 2 and then pressed by a mold while being heated, a softened glass material may flow into upper sides of the lead frames LFa and LFb through the through holes 7 in a short time. The other structures, the material of the lead frames LFa and LFb, the material of the glass substrate 2, and the sealing material 5 are the same as in Embodiment 1 and thus the description is omitted.

In this structure, the number of through holes 7 provided in each of the lead frames LFa and LFb is one. A large number of through holes 7 may be provided. The large number of through holes 7 cause the flow of the glass material to improve in the case where the glass substrate 2 is softened.

(Variation 2)

Figure 3:
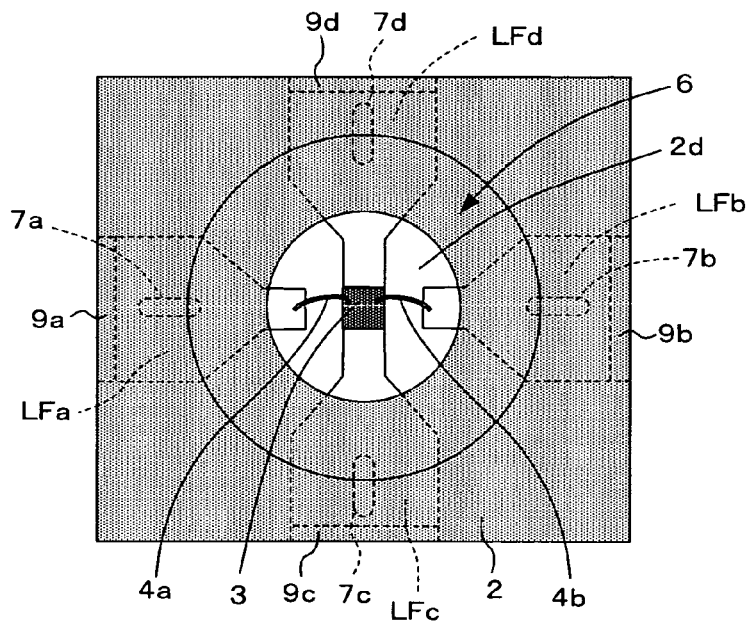
FIG. 3 is a schematic explanatory top view illustrating a lighting device according to variation 2 of Embodiment 1.

A lighting device 1 illustrated in FIG. 3 is another example of transforming the composition shown in FIG. 2. The recess portion 6 is provided at the central portion of the surface of the glass substrate 2. The two lead frames LFa and LFb pass through the glass substrate 2 from a bottom surface 2d of the recess portion 6, are exposed on the side surfaces, and are opposed to each other. In this variation 2, lead frames LFc and LFd are further provided in a direction orthogonal to the direction in which the lead frames LFa and LFb are located. The respective lead frames LFa, LFb, LFc, and LFd are exposed on the bottom surface 2d of the recess portion 6 in the glass substrate 2, embedded in the glass substrate 2 in the circumference of the recess portion 6, exposed on the side surfaces of the glass substrate 2, and bonded to the glass substrate 2. Portions of the lead frames LFa, LFb, LFc, and LFd which are exposed on the side surfaces of the glass substrate 2 serve as terminals 9a, 9b, 9c, and 9d. The lead frames LFa, LFb, LFc, and LFd have through holes 7a, 7b, 7c, and 7d formed in regions of the lead frames LFa, LFb, LFc, and LFd which are embedded in the glass substrate 2. The lead frames LFc and LFd are formed of a single conductor sheet or a single conductor bar.

The LED 3 is an LED having a structure in which an anode electrode and a cathode electrode are formed on an upper surface, and is fixed by high-thermal conductivity adhesive onto the lead frames LFc and LFd located at a central part of the recess portion 6. The anode electrode (not shown) and the cathode electrode (not shown) which are formed in an upper portion of the LED 3 are electrically connected to the lead frames LFa and LFb through wires 4a and 4b, and hence power is supplied from the lead frames LFa and LFb to the LED 3.

The lead frames LFc and LFd serve as thermal conductors for radiating heat generated in the LED 3. In FIG. 3, the through holes 7c and 7d are formed in the lead frames LFc and LFd. However, when the through holes are reduced in size or eliminated, a thermal resistance of the lead frames LFc and LFd may be reduced to a value smaller than a thermal resistance of the lead frames LFa and LFb, and hence heat generated in the LED 3 may be effectively radiated to the outside. The other structures are the same as in FIGS. 1-2 and thus the description is omitted.

(Variation 3)

A lighting device 1 illustrated in FIGS. 4A and 4B is another example of transforming the composition shown in FIG. 3. FIG. 4A schematically illustrates a cross section of the lighting device 1 and FIG. 4B schematically illustrates a top outline of the lighting device 1. FIG. 4C is a top view illustrating a modified example of the lighting device 1 illustrated in FIG. 4B. As illustrated in FIG. 4B, the two lead frames LFa and LFb pass through the glass substrate 2 from the bottom surface of the recess portion 6 and are exposed on the side surfaces of the glass substrate 2. The lead frames LFc and LFd are further provided in the direction orthogonal to the direction in which the lead frames LFa and LFb are located. The respective lead frames LFa, LFb, LFc, and LFd are exposed on the bottom surface 2d of the recess portion 6 in the glass substrate 2 and embedded in the glass substrate 2 in the circumference of the recess portion 6. The respective lead frames LFa, LFb, LFc, and LFd protrude from the side surfaces of the glass substrate 2 and protruding portions of the respective lead frames LFa, LFb, LFc, and LFd serve as terminals 10a, 10b, 10c and 10d. Therefore, the terminals 10a and 10b serve as power supplies to the LED 3 and the terminals 10c and 10d serve as radiation fins. The other structures are the same as in Embodiment 3 and thus the description is omitted.

In the structure illustrated in FIG. 4C, terminals 10'c and 10'd are formed to be larger in area than the terminals 10c and 10d. Therefore, the terminals 10'c and 10'd have a higher function as radiation fin, and hence heat generated in the LED 3 may be more efficiently radiated to the outside.

(Variation 4)

Figure 5:
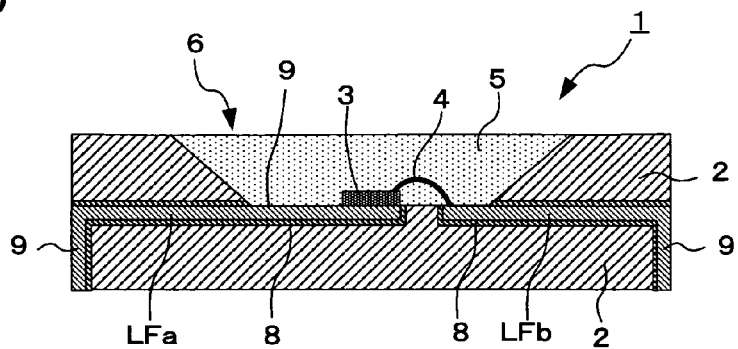
FIG. 5 is a schematic cross sectional view illustrating a lighting device according to variation 4 of Embodiment 1.

A lighting device 1 illustrated in FIG. 5 is another example of transforming the composition shown in FIG. 1. In this variation 4, oxide films are formed at bonding interfaces between the glass substrate 2 and the lead frames LFa and LFb to improve the bonding between the glass substrate 2 and the lead frames LFa and LFb.

As illustrated in FIG. 5, the recess portion 6 is formed in the central portion of the glass substrate 2. The recess portion 6 has the mortar shape in which the diameter is increased in the upward direction. The lead frames LFa and LFb are exposed on the bottom surface of the recess portion 6 in the glass substrate 2, pass through the glass substrate 2 in the circumference of the recess portion 6, and are exposed on the side surfaces of the glass substrate 2. The LED 3 which is the light emitting element is mounted on the surface of the lead frame LFa exposed on the bottom surface of the recess portion 6. An oxide film 8 obtained by oxidizing a metal material of the lead frames LFa and LFb is formed between the lead frames LFa and LFb and the glass substrate 2. With the oxide film 8 being thus formed, the bonding or adhesion between the glass substrate 2 and the lead frames LFa and LFb is improved. Portions of the oxide film 8 are removed at least from a surface of the lead frame LFa on which the LED 3 is mounted, a connection surface of the lead frame LFb with the wire 4, and exposed surfaces of terminals 9 of the lead frames LFa and LFb in order to make electrical connection with other terminals.

(Variation 5)

Figure 6:
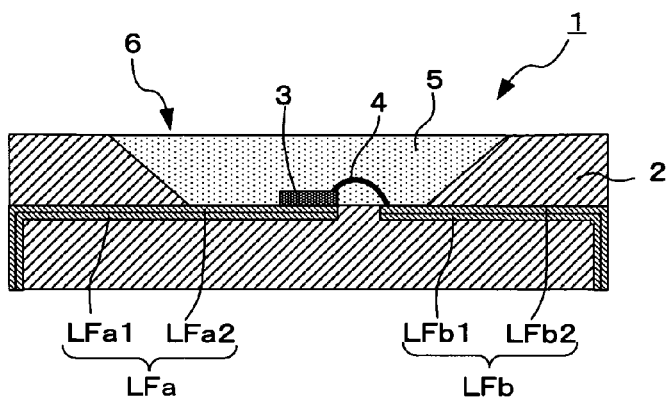
FIG. 6 is a schematic cross sectional view illustrating a lighting device according to variation 5 of Embodiment 1.

A lighting device 1 illustrated in FIG. 6 is another example of transforming the composition shown in FIG. 1. In this variation 5, a clad material in which two or more kinds of different metals are bonded to each other is used for the lead frames LFa and LFb. For example, assume that a first layer is a NiFe alloy layer (LFa1 and LFb1) and a second layer is a Cu layer (LFa2 and LFb2). A NiFe alloy layer may be further provided as a third layer. The other structures are the same as the structure shown in FIG. 1 and thus the description is omitted.

With this structure, the lead frames LFa and LFb are close in thermal expansion coefficient to the glass material 2, and hence, for example, the thermal expansion coefficient difference is set to a value equal to or smaller than $4 \times 10^{-6}$/K. In addition, a small electrical resistance and a high thermal conductivity may be obtained. Thus, a voltage drop in a case where power is supplied to the LED 3 may be reduced. Heat generated in the LED 3 may be efficiently radiated through the lead frames LFa and LFb. When the first layer of the lead frames LFa and LFb is the NiFe alloy layer and the second layer on which the LED 3 is mounted is the Cu layer, soldering to the lead frames LFa and LFb may be achieved. Even when the NiFe alloy layer is exposed to the outside, soldering is facilitated by plating with Cu or Au.

(Variation 6)

Figure 7A:
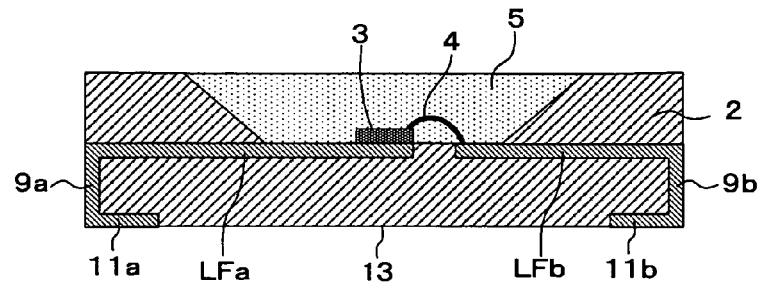
FIGS. 7A and 7B are schematic cross sectional views illustrating a lighting device according to variation 6 of Embodiment 1.
Figure 7B:
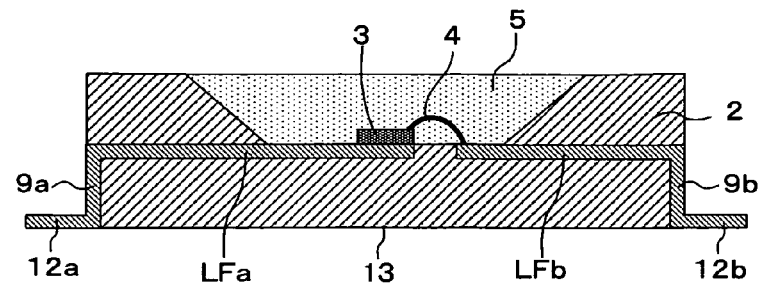

Lighting devices 1 illustrated in FIGS. 7A and 7B are other examples of transforming the composition shown in FIG. 1. In this variation 6, terminals exposed on the side surfaces of the lighting device 1 are bent along the same plane as a rear surface 13 of the lighting device 1. Structures except for the terminals exposed on the side surfaces are the same as above explained structures and thus the description is omitted.

In FIG. 7A, the lead frames LFa and LFb exposed on the side surfaces of the lighting device 1 are bent and bonded to the side surfaces and the rear surface 13 of the glass substrate 2, to thereby form two terminals 11a and 11b. Therefore, the lighting device 1 is easily mounted on a circuit board without requiring a space. In FIG. 7B, the lead frames LFa and LFb exposed on the side surfaces of the glass substrate 2 are bent and bonded to the side surfaces of the glass substrate 2. The lead frames LFa and LFb are further bent so as to protrude from the side surfaces on the same plane as the rear surface 13 of the glass substrate 2, to thereby form two terminals 12a and 12b. Therefore, the lighting device 1 is easily mounted on a circuit board and the radiation effect may be improved.

In each of structures shown in FIGS. 1 to 7 described above, the thermal conductivity of the region of the lead frame LFa on which the LED 3 is mounted is preferably maximized. With respect to a cross sectional area of a plane orthogonal to a heat transfer direction in the regions of the lead frames LFa and LFb which are embedded in the glass substrate 2, the cross sectional area of the plane of the lead frame LFa on which the LED 3 is mounted is set to a value larger than the cross sectional area of the plane of the lead frame LFb which is connected with the wire 4. The cross sectional area of the plane of the lead frame LFb is set to a value capable of supplying necessary power to the LED 3. With this structure, the material of the lead frames LFa and LFb may be effectively used and a manufacturing cost may be reduced. In the lighting device 1 in which the three or more lead frames as shown in FIG. 3 or FIGS. 4A to 4C are formed, the cross sectional areas of the entire lead frames LFc and LFd to which the LED 3 is fixed is desirably set to a value larger than the cross sectional area of the entire lead frames LFa and LFb.

[Embodiment 2]

Figure 8A:
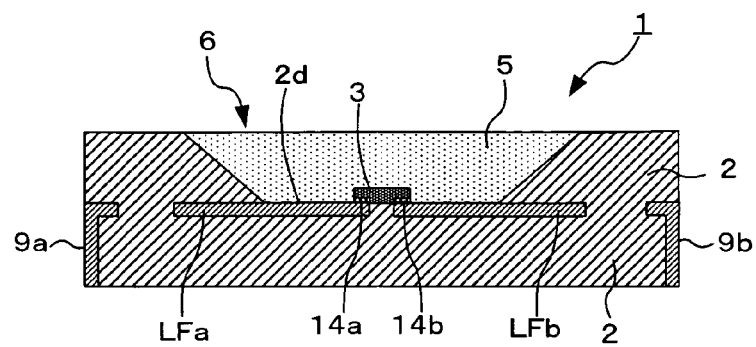
FIGS. 8A and 8B are schematic explanatory views illustrating a lighting device according to Embodiment 2 of the present invention.
Figure 8B:
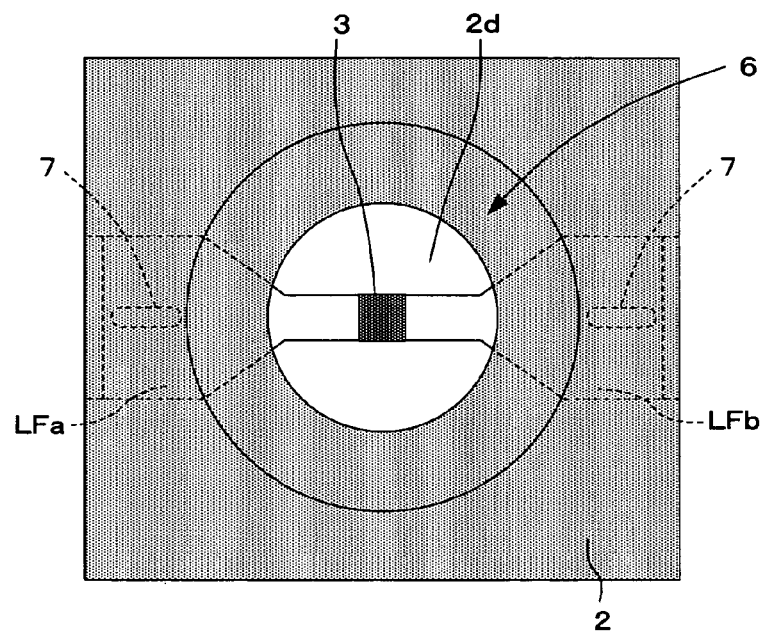

FIGS. 8A and 8B schematically illustrate a lighting device 1 according to Embodiment 2. FIG. 8A is a cross sectional view illustrating the lighting device 1 and FIG. 8B is a top view illustrating the lighting device 1. In this embodiment, the LED 3 is surface-mounted on the lead frames LFa and LFb.

As illustrated in FIGS. 8A and 8B, the recess portion 6 is formed on the glass substrate 2. The lead frames LFa and LFb are exposed on the bottom surface 2d of the recess portion 6, pass through the glass substrate 2 in the circumference of the recess portion 6, and exposed on the side surfaces of the glass substrate 2. The lead frames LFa and LFb are bonded to the glass substrate 2 on the bottom surface 2d of the recess portion 6, embedded in the glass substrate 2 in the circumference of the recess portion 6, bent along the side surfaces of the glass substrate 2, and bonded to the glass substrate 2. The lead frames LFa and LFb have the through holes 7 in the regions of the lead frames LFa and LFb which are embedded in the glass substrate 2. Portions of the lead frames LFa and LFb which are located on the side surfaces of the glass substrate 2 serve as the terminals 9a and 9b. The LED 3 is surface-mounted through conductive materials 14a and 14b on portions of the lead frames LFa and LFb which are exposed on the bottom surface 2d of the recess portion 6. The LED 3 is sealed with the sealing material 5. By using an alloy such as SnAgCu or AuSn, or using a conductive bonding material, flip-chip bonding may be performed.

In this way, the wire bonding is unnecessary, and hence the number of manufacturing steps may be reduced to reduce a manufacturing cost. Heat generated in the LED 3 may be radiated to the outside through the two lead frames LFa and LFb, and hence the radiation effect may be improved. It is unnecessary to form the wire, and hence the thickness of the lighting device 1 may be reduced. The other structures are the same as in Embodiment 1 and thus the description is omitted.

[Embodiment 3]

Figure 9A:
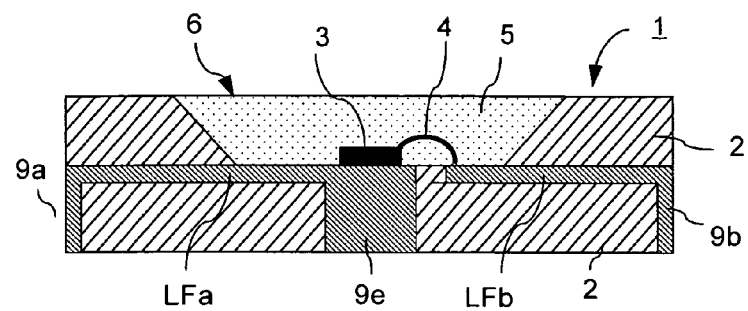
FIGS. 9A and 9B are schematic explanatory views illustrating a lighting device according to Embodiment 3 of the present invention.
Figure 9B:
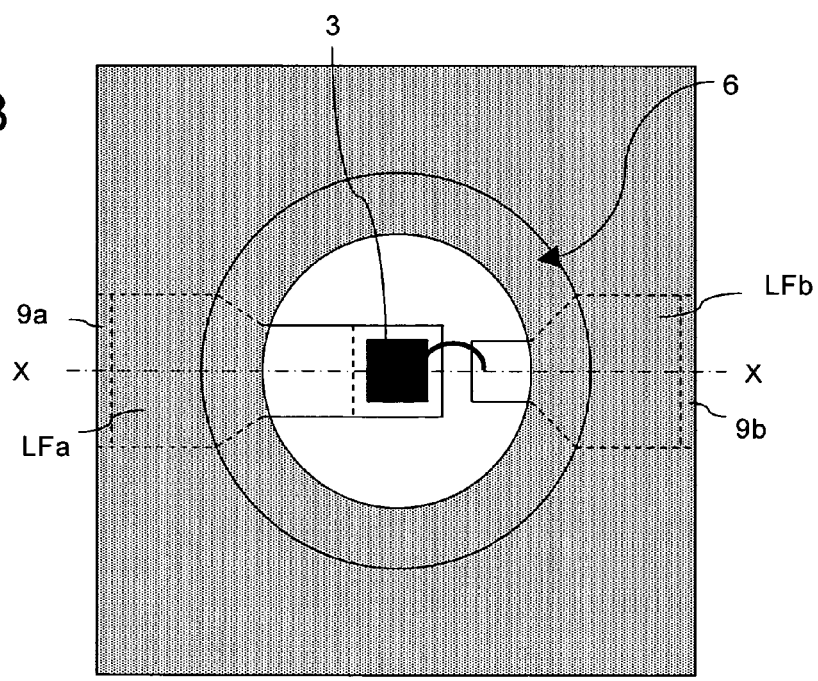

FIGS. 9A and 9B schematically illustrate a lighting device 1 according to Embodiment 3. FIG. 9B is a top view illustrating the lighting device 1 and FIG. 9A illustrates a cross section of a portion taken along the line X-X of FIG. 9B. The recess portion 6 is provided at the central portion of the glass substrate 2. The recess portion 6 has the mortar shape in which the diameter is increased in the upward direction. As in Embodiment 1, the lead frames LFa and LFb are provided to pass through the glass substrate 2 in the circumference of the recess portion 6 in the lateral direction and exposed on the bottom surface of the recess portion 6 and the side surfaces of the glass substrate 2. The portions of the lead frames LFa and LFb which are exposed on the side surfaces are used as the terminals 9a and 9b. The lead frame LFa has a projected portion 9e formed on the rear side of the surface on which the LED 3 is mounted. The projected portion 9e passes through the glass substrate 2 and exposed on the rear surface of the glass substrate. Heat generated in the LED 3 may be radiated to the outside through the lead frame LFa or the projected portion 9e. In this embodiment, a thermal resistance of the projected portion 9e is remarkably small. Therefore, when a heat sink is boned to the projected portion 9e, a high radiation effect may be obtained. Note that the terminals 9a and 9b are used as power supply terminals for emitting light from the LED 3. The projected portion 9e may be used instead of the terminal 9a.

The lead frame having the projected portion may be easily manufactured by a roll bonding method, a plastic working method such as deformation processing or press working, or a welding method. The other structures, the material of the glass substrate 2, and the sealing material 5 are the same as in Embodiment 1 and thus the description is omitted. The fact that the flow of the glass material of the softened glass substrate 2 is improved in the case where the through holes are provided in the lead frames as in variation 2 of Embodiment 1.

(Variation 7)

Figure 10A:
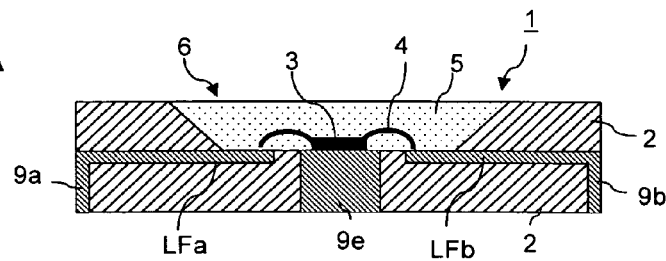
FIGS. 10A to 10C are schematic explanatory views illustrating a lighting device according to variation 7 of Embodiment 3.
Figure 10B:
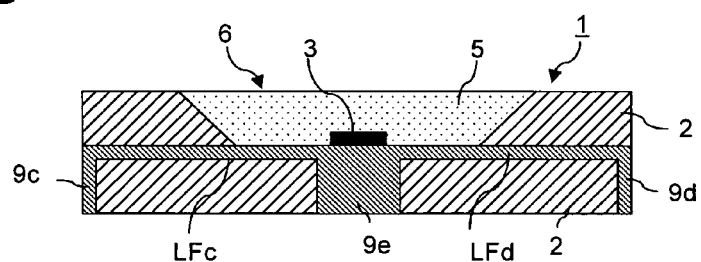
Figure 10C:
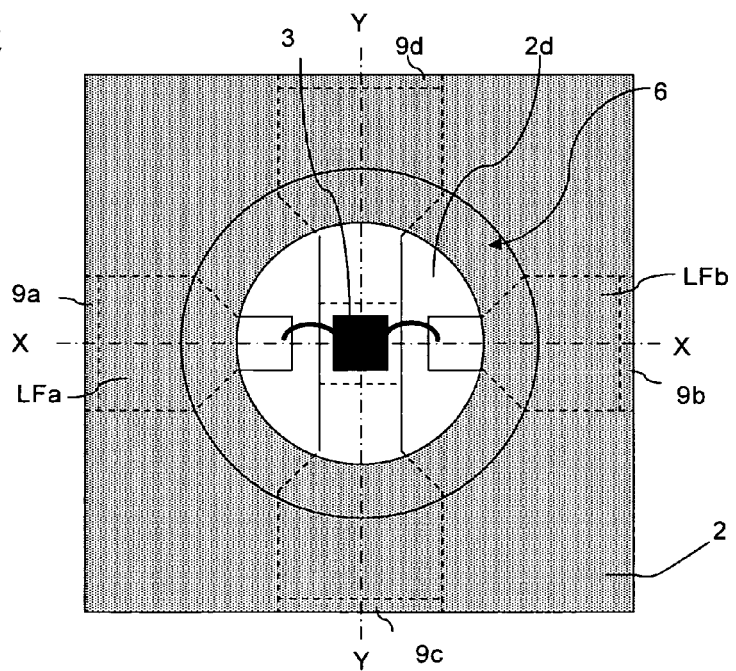

A lighting device 1 illustrated in FIGS. 10A to 10C is another example of transforming the composition shown in FIG. 9. FIG. 10C is a top view illustrating the lighting device 1. FIG. 10A illustrates a cross section of a portion taken along the line X-X of FIG. 10C. FIG. 10B illustrates a cross section of a portion taken along the line Y-Y of FIG. 10C. As illustrated in FIGS. 10A and 10B, the projected portion 9e is formed on the rear side of the lead frames in the mounting portion of the LED 3, passes through the glass substrate 2, and is exposed on the rear surface of the glass substrate. Heat generated in the LED 3 may be radiated to the outside through the projected portion 9e of the lead frames. Therefore, for example, when a heat sink is boned to the projected portion 9e, a high radiation effect may be obtained. Note that the terminals 9a, 9b, 9c, and 9d are used as the power supply terminals for emitting light from the LED 3. The projected portion 9e may be used instead of the terminal 9c or 9d.

The lead frames having the projected portion may be easily manufactured by a roll bonding method, a plastic working method such as deformation processing or press working, or a welding method. The other structures, the material of the glass substrate 2, and the sealing material 5 are the same as in Embodiment 1 and thus the description is omitted. The fact that the flow of the glass material of the softened glass substrate 2 is improved in the case where the through holes are provided in the lead frames as in Embodiment 3 is the same as Embodiment 3.

In each of the structures described above, the two-dimensional shape of the lighting device 1 is assumed to be a square shape and the recess portion 6 is assumed to have a round mortar shape. However, the present invention is not limited to such shapes. The two-dimensional shape of the lighting device 1 may be a circular shape or a polygonal shape other than a square shape. The recess portion 6 may have a square or other polygonal shape or have an arc or hyperbolic inclined surface.

As described above, in the lighting device according to the present invention, the lead frames are embedded in the glass substrate so as to be exposed on the side surfaces of the glass substrate and the bottom surface of the recess portion. The light emitting element to be mounted is electrically connected to the portions of the lead frames exposed on the recess portion. With this structure, an electronic device of which airtightness and reliability in a temperature cycle are high may be provided.

Next, a method of manufacturing the lighting device 1 is described with reference to FIGS. 11A to 11H, 12A to 12C, 13A to 13C, 14A and 14B, 15A to 15C, 16A and 16B, 17A and 17B, and 18A to 18G.

FIRST REFERENCE EXAMPLE

FIGS. 11A to 11H are flow views illustrating the method of manufacturing the lighting device 1. In this reference example, the lead frames LFa and LFb in which the through holes 7 are formed are used.

(Setting Step)

FIG. 11A is a schematic view illustrating a setting step. The two lead frames LFa and LFb are set on a glass plate 18. The lead frames LFa and LFb each are made of a plate-shaped conductor and opposed to each other. FIG. 11E schematically illustrates the lead frames LFa and LFb. The lead frames LFa and LFb have the through holes 7a and 7b formed in widened portions to facilitate the rapid flow of a softened glass material. The glass plate 18 on which the lead frames LFa and LFb are set are provided between a lower mold 19 having a recess portion 20 and an upper mold 15 having a projected portion 16 formed on a surface. The projected portion 16 of the upper mold 15 is opposed to the lead frames LFa and LFb.

(Bonding Step)

Next, the lower mold 19, the upper mold 15, and the glass plate 18 are heated to soften the glass plate 18. The glass plate 18 is heated and the lower mold 19 and the upper mold 15 are pressed in directions indicated by arrows. Then, an upper surface of the projected portion 16 formed on the surface of the upper mold 15 are in contact with the lead frames LFa and LFb. Therefore, a part of the glass material of the glass plate 18 flows to a recess portion 17 of the upper mold 15. The lead frames LFa and LFb have the through holes 7a and 7b, respectively, and hence the flow of the part of the glass material of the glass plate 18 is promoted.

FIG. 11B is a cross sectional view illustrating the glass substrate 2 taken out from the lower mold 19 and the upper mold 15 and FIG. 11F is a top view illustrating the glass substrate 2. The recess portion 6 is formed corresponding to the projected portion 16 of the upper mold 15 on the upper surface side of the glass substrate 2. Respective end portions of the lead frames LFa and LFb are exposed on the bottom surface 2d of the recess portion 6 in the outside and bonded to surfaces of the glass substrate 2. The lead frames LFa and LFb are embedded in the glass substrate 2 in the circumference of the recess portion 6 and bonded to the glass substrate 2. The lead frames LFa and LFb protrude from the side surfaces of the glass substrate 2 and the protruded portions of the lead frames LFa and LFb serve as terminals 10a and 10b.

(Mounting Step)

FIG. 11C is a schematic view illustrating a state in which the LED 3 is mounted as the light emitting element on the lead frame LFa exposed on the bottom surface 2d of the recess portion 6 and FIG. 11G is a top view illustrating the state. By bonding using an alloy such as SnAgCu or AuSn, or using a conductive bonding material, mounting may be performed. An electrode (not shown) formed on the upper surface of the LED 3 and the exposed lead frame LFb are connected to each other by wire bonding using the wire 4 made of Au or the like.

(Sealing Step)

FIG. 11D is a cross sectional view illustrating a state in which the sealing material 5 is applied to the recess portion 6 and FIG. 11H is a top view illustrating the state. The sealing material 5 made of a transparent resin is applied to seal the electronic part (LED) 3 and the wire 4. The sealing material 5 to be used may be a silicon oxide obtained by curing metal alkoxide or polymetalloxane generated from metal alkoxide. To be specific, a solution containing metal alkoxide is filled to the recess portion 6 by a dispenser or the like. For example, a mixture of $nSi(OCH_3)_4$, $4nH_2O$, $NH_4OH$ (catalyst), and dimethylformamide (DMF) (anti-cracking agent) may be used. The mixture is hydrolyzed and polymerized in a temperature range of room temperature to approximately 60° C. to form a polymetalloxane sol. The mixture is further polymerized in the temperature range of room temperature to 60° C. to form a wetting gel of silicon oxide, and then dried and fired at a temperature of approximately 100° C. or a temperature equal to or higher than 100° C. to form the silicon oxide. Alternatively, polymetalloxane may be filled and then polymerized and fired as described above to form the silicon oxide.

When metal alkoxide or polymetalloxane generated from metal alkoxide is used as the sealing material 5 as described above, the lighting device 1 may be manufactured using only inorganic materials. Therefore, the materials may be prevented from being discolored by ultraviolet light or visible light emitted from the LED 3.

As described above, the recess portion 6 is formed on the glass substrate 2, and simultaneously the lead frames LFa and LFb are embedded in the circumference of the recess portion and protruded from the glass substrate 2 to form the terminals 10a and 10b. When the glass substrate 2 is bonded to the lead frames LFa and LFb by such a manner, the contact and airtightness are excellent, and hence the lighting device 1 having high reliability may be realized. The LED 3 is mounted after the glass plate 18 is softened to form the recess portion 6, and hence the wire may be formed by wire bonding frequently used in semiconductor techniques.

Further, in order to use a wall surface of the recess portion 6 as a reflective surface, a metal film or a dielectric multilayer film may be formed to have a high reflectance. Therefore, light emitted from the lighting device 1 is easily provided with directivity. A material exhibiting white color or milky white color may be used for the glass substrate 2, and hence a reflective layer less discolored with the lapse of time may be provided. A material with a viscosity suitable to disperse phosphors may be selected as the sealing material 5. The sealing material 5 is not exposed to a temperature at which the glass substrate 2 is softened, and hence a choice among phosphor materials mixed into the sealing material 5 is expanded.

SECOND REFERENCE EXAMPLE

FIGS. 12A to 12C, 13A to 13C, 14A and 14B, 15A to 15C, 16A and 16B, and 17A and 17B are explanatory flow views illustrating a method of manufacturing the lighting device 1 in this reference. In this reference, the lead frames LFa and LFb are sandwiched between a first glass substrate 2a and a second glass substrate 2b and then inserted between the upper mold 15 and the lower mold 19 to bond the first glass substrate 2a and the second glass substrate 2b to the lead frames LFa and LFb.

(Preparation Step)

Figure 12A:
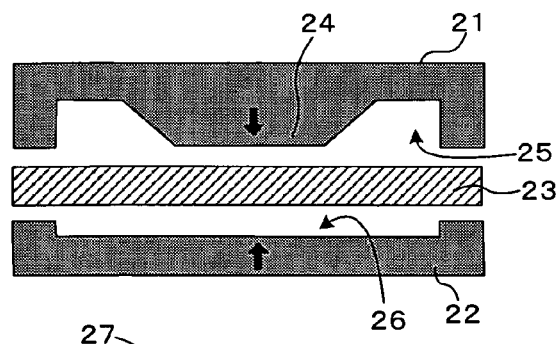
FIGS. 12A to 12C are schematic views illustrating a lighting device manufacturing method.
Figure 12B:
Figure 12C:
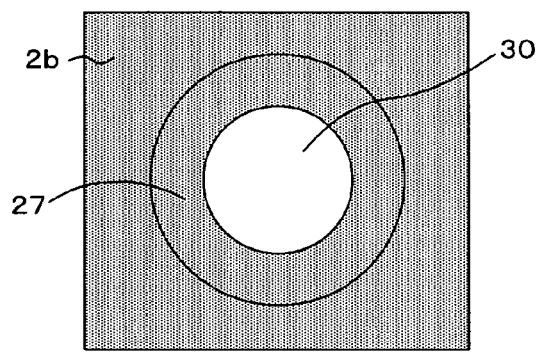
Figure 13A:
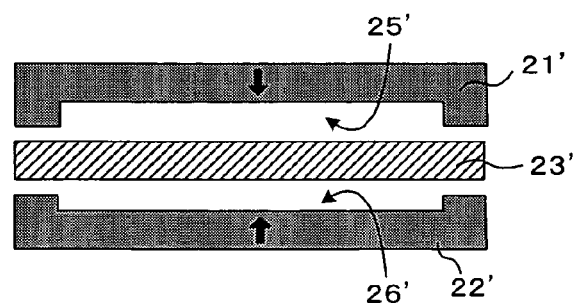
FIGS. 13A to 13C are schematic explanatory views illustrating the lighting device manufacturing method.
Figure 13B:
Figure 13C:
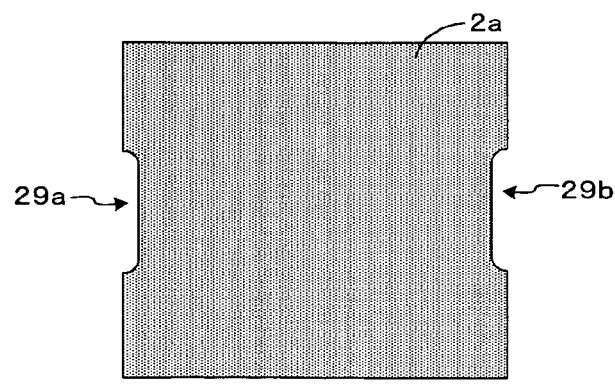

FIGS. 12A to 12C are schematic explanatory views illustrating a step of preparing the second glass substrate 2b. FIGS. 13A to 13C are schematic explanatory views illustrating a step of preparing the first glass substrate 2a. Each of the first glass substrate 2a and the second glass substrate 2b is formed by a molding method using a softened glass plate.

FIG. 12A is a schematic view illustrating a state in which an upper glass plate 23 is inserted between a lower mold 22 and an upper mold 21. As illustrated in FIG. 12A, the lower mold 22 has a recess portion 26 formed on a surface. The upper mold 21 has a projected portion 24 formed on a surface and a recess portion 25 located around the projected portion 24. The upper glass plate 23 is inserted between the lower mold 22 and the upper mold 21, heated at a temperature at which the upper glass plate 23 is softened, and the upper mold 21 is pressed to the lower mold 22. As a result, as illustrated in FIGS. 12B and 12C, the second glass substrate 2b having an opening portion 30 located at a central portion is formed. The opening portion 30 is surrounded by an inclined surface 27 of the second glass substrate 2b. FIG. 12B is a cross sectional view illustrating the second glass substrate 2b and FIG. 12C is a top view illustrating the second glass substrate 2b.

FIG. 13A is a schematic view illustrating a state in which a lower glass plate 23' is inserted between a lower mold 22' and an upper mold 21'. As illustrated in FIG. 13A, the lower mold 22' has a recess portion 26' formed on a surface and the upper mold 21' also has a recess portion 25'. The lower glass plate 23' is inserted between the lower mold 22' and the upper mold 21', heated at a temperature at which the lower glass plate 23' is softened, and the upper mold 21' is pressed to the lower mold 22'. As a result, as illustrated in FIGS. 13B and 13C, electrode bonding portions 29a and 29b so as to be bonded to the terminals 9a and 9b of the lead frames LFa and LFb are formed in right and left end portions of the first glass substrate 2a. FIG. 13B is a cross sectional view illustrating the first glass substrate 2a and FIG. 13C is a top view illustrating the first glass substrate 2a.

Figure 14A:
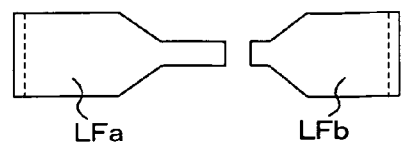
FIGS. 14A and 14B are schematic explanatory views illustrating the lighting device manufacturing method.
Figure 14B:

FIGS. 14A and 14B are schematic explanatory views illustrating a step of preparing the lead frames LFa and LFb. FIG. 14A is a top view illustrating the lead frames LFa and LFb and FIG. 14B is a side view illustrating the lead frames LFa and LFb. A conductor plate made of a metal or an alloy is formed into a predetermined shape by stamping using a mold or by etching, and then bent at end portions to form the lead frames LFa and LFb. The bent end portions serve as the terminals 9a and 9b for power supply and radiation. Each of the lead frames LFa and LFb is formed such that a width corresponding to the central portion of the lighting device 1 is narrow and a width corresponding to the peripheral portion of the lighting device 1 is wide. The narrow portions of the two lead frames LFa and LFb are opposed to each other. Through holes may be provided in the wide portions of the lead frames LFa and LFb in order to improve the flow of the softened glass material.

(Setting Step)

Figure 15A:
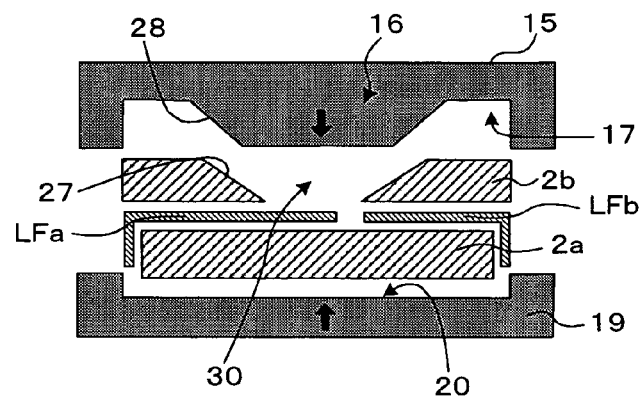
FIGS. 15A to 15C are schematic views illustrating a setting step and a bonding step in the lighting device manufacturing method.

FIG. 15A is a schematic view illustrating a setting step. The lead frames LFa and LFb are set so as to be opposed to each other on the first glass substrate 2a. Then, the second glass substrate 2b is set on the lead frames LFa and LFb and the first glass substrate 2a. During this state, the first glass substrate 2a and the second glass substrate 2b are set between the lower mold 19 and the upper mold 15. The lower mold 19 has the recess portion 20 formed on the surface. The upper mold 15 has the projected portion 16 formed on the surface and the recess portion 17 formed around the projected portion 16. The material of the first and second glass substrates 2a and 2b, the material of the lead frames LFa and LFb, and the thermal expansion coefficient are the same as those in Embodiment 1 and thus the description is omitted.

The projected portion 16 of the upper mold 15 is larger in diameter than the opening portion 30 of the second glass substrate 2b. A depth of the recess portion 17 of the upper mold 15 is larger than a thickness of the second glass substrate 2b, that is, deeper than the thickness of the second glass substrate 2b. This is because the material of the second glass substrate 2b is allowed to flow into the recess portion 17 of the upper mold 15 in the case where the second glass substrate 2b is softened and the upper mold 15 is pressed to the lower mold 19.

(Bonding Step)

Next, the lower mold 19, the upper mold 15, and the first and second glass substrates 2a and 2b are heated to soften the first and second glass substrates 2a and 2b. During this state, the lower mold 19 and the upper mold 15 are pressed in directions indicated by arrows. Then, an upper surface of the projected portion 16 formed on the surface of the upper mold 15 are in contact with the lead frames LFa and LFb. Therefore, the glass material of at least one of the first and second glass substrates 2a and 2b flows into the recess portion 17 of the upper mold 15. When each of the lead frames LFa and LFb has the through hole, the flow of the glass material is promoted.

Figure 15B:
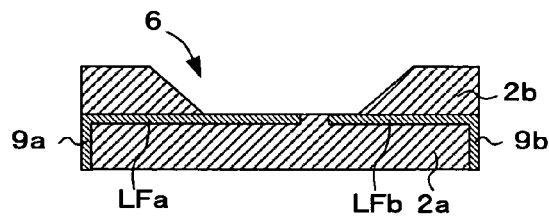
Figure 15C:
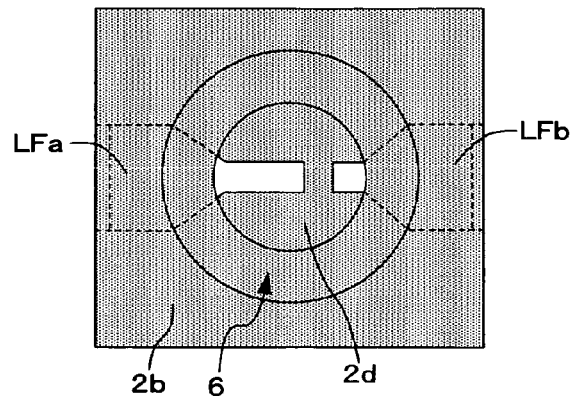

FIGS. 15B and 15C schematically illustrate a package base member obtained by the method described above. That is, FIG. 15B is a cross sectional view illustrating the glass substrate 2 taken out from the molds after the lead frames LFa and LFb, the first glass substrate 2a, and the second glass substrate 2b are bonded together and FIG. 15C is a top view illustrating the glass substrate 2. As illustrated in FIGS. 15B and 15C, the recess portion 6 is formed corresponding to the projected portion 16 of the upper mold 15 on the upper surface side of the glass substrate 2. The respective end portions of the lead frames LFa and LFb are exposed on the bottom surface 2d of the recess portion 6 in the outside and bonded to the surfaces of the glass substrate 2. The lead frames LFa and LFb are embedded in the glass substrate 2 in the circumference of the recess portion 6 and bonded to the glass substrate 2. The end portions of the lead frames LFa and LFb are bonded to the side surfaces of the glass substrate 2 to form the terminals 9a and 9b.

(Mounting Step)

Figure 16A:
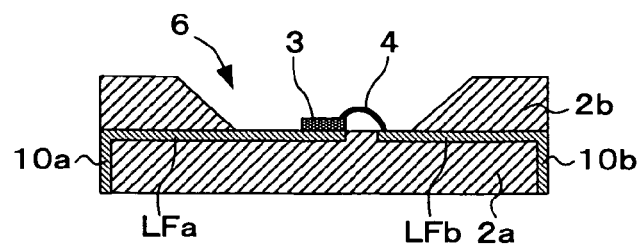
FIGS. 16A and 16B are schematic views illustrating a mounting step in the lighting device manufacturing method.
Figure 16B:
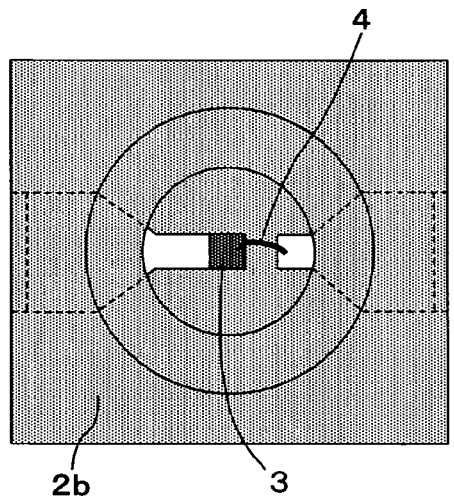

FIGS. 16A and 16B are schematic views illustrating a state in which the LED 3 is mounted as the light emitting element on the lead frame LFa exposed on the bottom surface of the recess portion 6. FIG. 16A is a cross sectional view illustrating the state and FIG. 16B is a top view illustrating the state. As illustrated in FIG. 16A, the LED 3 is mounted on the lead frame LFa through a conductive material (not shown). By using an alloy such as SnAgCu or AuSn, or using a conductive bonding material, bonding may be performed. An upper electrode (not shown) of the LED 3 and the exposed lead frame LFb are connected to each other by wire bonding using the wire 4 made of Au or the like.

(Sealing Step)

Figure 17A:
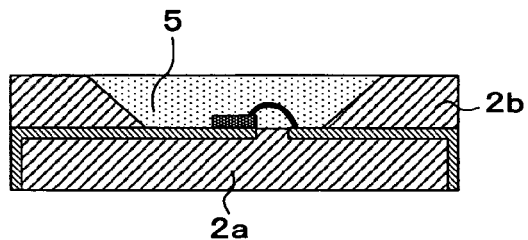
FIGS. 17A and 17B are schematic views illustrating a sealing step in the lighting device manufacturing method.
Figure 17B:
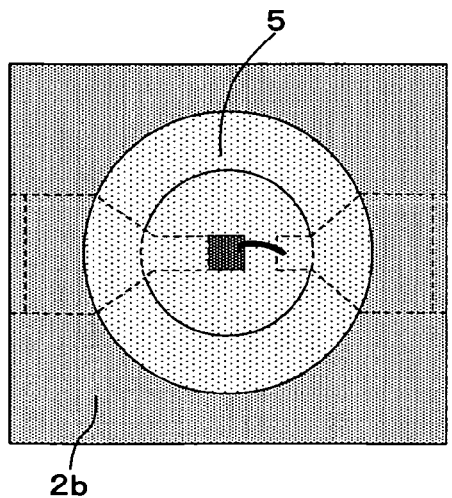
Figure 19:
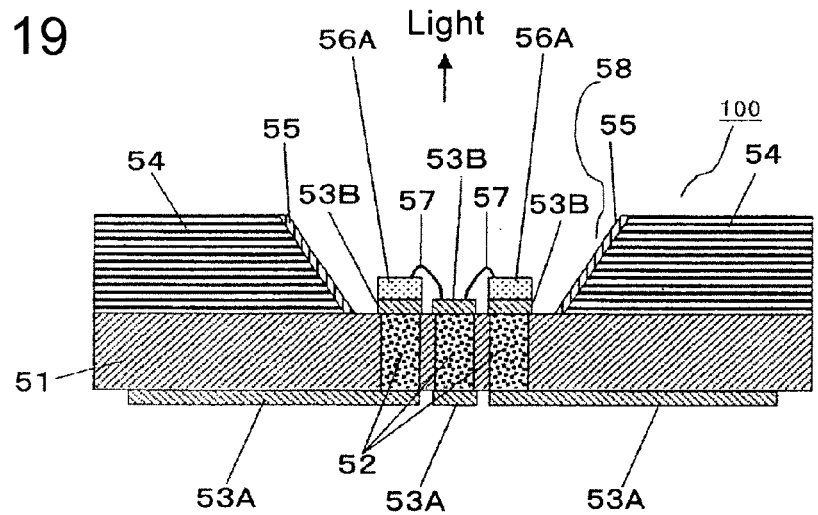
FIG. 19 is a cross sectional view illustrating a conventionally well-known LED lighting device.
Figure 20:
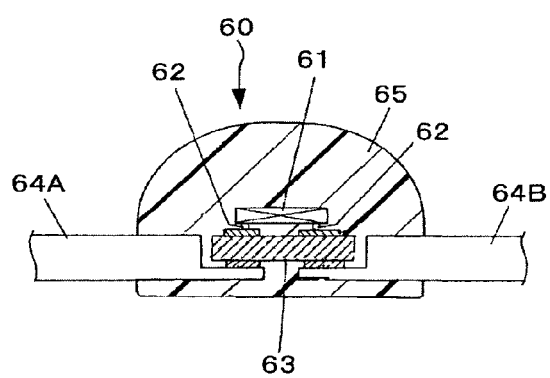
FIG. 20 is a cross sectional view illustrating a conventionally well-known lighting device.
Figure 21:
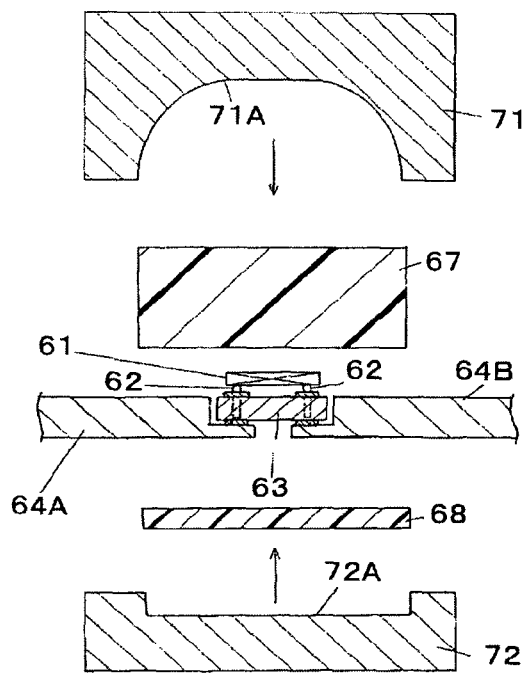
FIG. 21 illustrates a state in which glass sealing is performed using a mold for the conventionally well-known lighting device.

FIG. 17A is a cross sectional view illustrating a state in which the sealing material 5 is applied to the recess portion 6 and FIG. 17B is a top view illustrating the state. The sealing material 5 made of a transparent resin is applied to seal the LED 3 and the wire 4. The sealing material 5 to be used may be a silicon oxide obtained by curing metal alkoxide or polymetalloxane generated from metal alkoxide. A specific example is the same as in First Reference Example and therefore the description is omitted.

As described above, the recess portion 6 is formed on the glass substrate 2, and simultaneously the lead frames LFa and LFb are embedded in the circumference of the recess portion 6 to form the terminals, and hence the number of manufacturing steps may be reduced to reduce a manufacturing cost. In particular, the recess portion 6 is formed from the second glass substrate 2b, and hence a flow distance of the glass material is reduced. Therefore, the lead frames LFa and LFb may be bonded to the glass substrate 2 in a short time. When the glass substrate 2 is bonded to the lead frames LFa and LFb, the contact and airtightness are excellent, and hence the lighting device 1 having high reliability may be manufactured. The LED 3 is mounted after the second glass substrate 2b is softened to form the recess portion 6, and hence the wire may be formed by wire bonding frequently used in semiconductor techniques. When a wall surface of the recess portion 6 is to be used as a reflective surface, a metal film or a dielectric multilayer film may be formed to have a high reflectance. Therefore, light emitted from the lighting device 1 is easily provided with directivity. A material exhibiting white color or milky white color may be used for the second glass substrate 2b, and hence a reflective layer less discolored with the lapse of time may be provided. A material with a viscosity suitable to disperse phosphors may be selected as the sealing material 5. The sealing material 5 is not exposed to a temperature at which the glass substrate 2 is softened, and hence a choice among phosphor materials for converting a wavelength of light emitted from the LED 3 is expanded.

THIRD REFERENCE EXAMPLE

FIGS. 18A to 18G are schematic explanatory views illustrating a method of manufacturing the lighting device 1. In this reference example, oxide films are formed on the surfaces of the lead frames LFa and LFb before the bonding step, to thereby improve the bonding between the lead frames LFa and LFb and the glass substrate 2.

FIG. 18A is a cross sectional view illustrating a state in which the lead frames LFa and LFb are formed by stamping a metal or alloy plate. FIG. 18B is a cross sectional view illustrating an oxidation step for forming the oxide films on the surfaces of the lead frames LFa and LFb. The lead frames LFa and LFb are subjected to heat treatment in an oxygen atmosphere to form oxide films 31 on the surfaces. For example, the heat treatment is performed in an atmosphere containing moisture. When a NiFe alloy, for example, Kovar is to be used for the lead frames LFa and LFb, the oxidation treatment is performed at a temperature equal to or higher than approximately 800° C. such that the surfaces become gray.

FIG. 18C is a cross sectional view illustrating a state in which the lead frames LFa and LFb are bent at end portions by press working. The bent portions serve as the terminals 9a and 9b. The oxidation step for forming the oxide films 31 on the surfaces may be performed after the lead frames LFa and LFb are bent.

FIG. 18D is a cross sectional view illustrating a state in which the lead frames LFa and LFb are bonded to the glass substrate 2. The setting step and the bonding step may be the same as those in First Reference Example or Second Reference Example and thus the description is omitted. As illustrated in FIG. 18D, the oxide films 31 are located at contact interfaces between the lead frames LFa and LFb and the glass substrate 2, and hence the contact and airtightness between the glass substrate 2 and the lead frames LFa and LFb are improved.

Next, reduction treatment is performed to remove oxide films from surfaces of the lead frames LFa and LFb which are exposed in the outside. FIG. 18E illustrates a state in which the oxide films 31 are selectively removed from the exposed surfaces of the lead frames LFa and LFb by an oxide film removal step. In the oxide film removal step, the glass substrate 2 is subjected to heat treatment in an atmosphere containing a hydrogen gas or a hydrogen gas mixed with an $N_2$ gas as a carrier gas. Alternatively, the oxide films are removed from the surfaces of the lead frames LFa and LFb by hydrofluoric acid or the like. A metal or an alloy is thus exposed on the mounting surface on which the LED 3 is mounted and the surfaces of the terminals 9a and 9b, and hence electrical connection with other conductive materials may be achieved.

FIG. 18F is a cross sectional view illustrating a mounting step of mounting the LED 3 on the lead frame LFa. FIG. 18G is a cross sectional view illustrating a state in which the LED 3 and the wire 4 are sealed with the sealing material 5. The mounting step and the sealing step may be the same as those in First Reference Example or Second Reference Example and thus the description is omitted. The oxidation treatment is desirably performed before the bonding step. Therefore, the oxidation treatment may be performed after the lead frames LFa and LFb are bent by press working (FIG. 18C) or before the stamping for the lead frames LFa and LFb (FIG. 18A). When resists are applied to or blocking plates are provided on the mounting surface of the LED 3 and regions corresponding to the terminals 9a and 9B to prevent oxidation before the oxidation treatment, the oxide film removal step described above is unnecessary.

What is claimed is:

1. A lighting device comprising:
    a glass substrate having a front surface, a side surface and a rear surface, the front surface having a recess portion with a bottom surface;
    a lead frame embedded in the glass substrate, the lead frame having a portion exposed on the side surface of the glass substrate and a portion exposed on the bottom surface of the recess portion, and a line width of a region of the portion of the lead frame exposed on the bottom surface of the recess portion being narrower than a line width of a region of the portion of the lead frame exposed on the side surface of the glass substrate;
    a light emitting element mounted in the recess portion of the glass substrate and electrically connected with the portion of the lead frame exposed on the bottom surface of the recess portion; and
    a sealing material covers the light emitting element.

2. A lighting device according to claim 1; wherein the lead frame includes a projected portion which passes through the glass substrate and which is exposed on the rear surface of the glass substrate, the projected portion being formed under a region of the recess portion of the glass substrate in which the light emitting element is mounted.

3. A lighting device according to claim 1; wherein the lead frame has a through hole formed in a region of the lead frame embedded in the glass substrate.

4. A lighting device according to claim 1; wherein the glass substrate comprises a mixture of a glass material and an oxide of a metal material so that at least the recess portion of the glass substrate is colored with one of white color and milky white color.

5. A lighting device according to claim 1; wherein the lead frame is formed of a clad material in which different metal materials are bonded to each other.

6. A lighting device according to claim 1; wherein the lead frame is formed of a metal material; and further comprising an oxide film at a bonding interface between the lead frame and the glass substrate, the oxide film being formed of an oxide of the metal material forming the lead frame.

7. A lighting device according to claim 1; wherein a thermal expansion coefficient difference between the glass substrate and the lead frame is equal to or smaller than $4 \times 10^{-6}$/K.

8. A lighting device according to claim 1; wherein the glass substrate has a thermal expansion coefficient in the range of $8 \times 10^{-6}$/K to $11 \times 10^{-6}$/K and the lead frame has a thermal expansion coefficient in the range of $4 \times 10^{-6}$/K to $15 \times 10^{-6}$/K.

9. A lighting device comprising:
    a substrate having a front surface, a side surface and a rear surface, the front surface having a recess portion with a bottom surface;
    a lead frame embedded in the substrate and made of a material different from that of the substrate such that a thermal expansion coefficient difference between the substrate and the lead frame is equal to or smaller than $4 \times 10^{-6}$/K, the lead frame having a portion exposed on the side surface of the substrate and a portion exposed on the bottom surface of the the recess portion, and a line width of a region of the portion of the lead frame exposed on the bottom surface of the recess portion of the substrate being narrower than a line width of a region of the portion of the lead frame exposed on the side surface of the substrate;
    a light emitting element mounted in the recess portion of the substrate and electrically connected with the portion of the lead frame exposed on the bottom surface of the recess portion; and
    a sealing material covering the light emitting element.

10. A lighting device according to claim 9; wherein the substrate is made of glass.

11. A lighting device according to claim 10; wherein the glass substrate comprises a mixture of a glass material and an oxide of a metal material so that at least the recess portion of the glass substrate is colored with one of white color and milky white color.

12. A lighting device according to claim 9; wherein the lead frame includes a projected portion which passes through the substrate and which is exposed on the rear surface of the substrate, the projected portion being formed under a region of the recess portion of the substrate in which the light emitting element is mounted.

13. A lighting device according to claim 9; wherein the lead frame has a through hole formed in a region of the lead frame embedded in the substrate.

14. A lighting device according to claim 9; wherein the lead frame is formed of a clad material in which different metal materials are bonded to each other.

15. A lighting device according to claim 9; wherein the substrate is made of glass.

16. A lighting device according to claim 9; wherein the lead frame is formed of a metal material; and further comprising an oxide film at a bonding interface between the lead frame and the substrate, the oxide film being formed of an oxide of the metal material forming the lead frame.

17. A lighting device comprising:
    a glass substrate having a front surface, a side surface and a rear surface, the front surface having a recess portion with a bottom surface, the glass substrate having a thermal expansion coefficient in the range of $8 \times 10^{-6}$/K to $11 \times 10^{-6}$/K;
    a metal lead frame embedded in the glass substrate and having a thermal expansion coefficient in the range of $4 \times 10^{-6}$/K to $15 \times 10^{-6}$/K, the metal lead frame having a portion exposed on the side surface of the glass substrate and a portion exposed on the bottom surface of the the recess portion, and a line width of a region of the portion of the metal lead frame exposed on the bottom surface of the recess portion of the glass substrate being narrower than a line width of a region of the portion of the metal lead frame exposed on the side surface of the glass substrate;
    an oxide film formed at a bonding interface between the metal lead frame and the glass substrate, the oxide film being formed of an oxide of the metal material forming the metal lead frame;
    a light emitting element mounted in the recess portion of the substrate and electrically connected with the portion of the lead frame exposed on the bottom surface of the recess portion; and
    a sealing material covering the light emitting element.

18. A lighting device according to claim 17; wherein the metal lead frame is formed of a clad material in which different metal materials are bonded to each other.

* * * * *